March 22, 1960

J. A. INGHAM 2,929,939

TRANSISTOR AMPLIFIER

Filed Nov. 17, 1955

INVENTOR.
JOHN A. INGHAM

BY

ATTORNEY

United States Patent Office 2,929,939

Patented Mar. 22, 1960

2,929,939

TRANSISTOR AMPLIFIER

John A. Ingham, Arlington, Va., assignor to Philco Corporation, Philadelphia, Pa., a corporation of Pennsylvania Application November 17, 1955, Serial No. 547,576

2 Claims. (Cl. 307—88.5)

Figure 1:
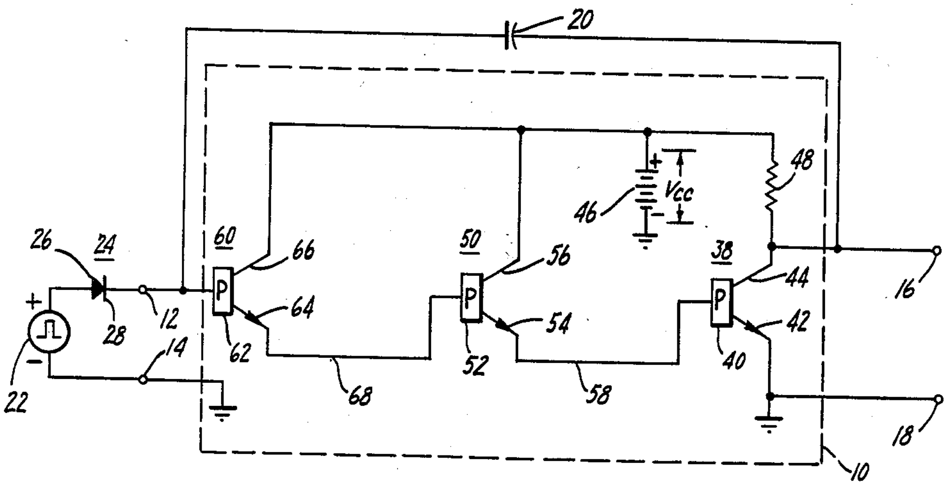

This invention relates to semiconductive circuit apparatus, and more particularly to transistor amplifiers having high input impedances and to apparatus utilizing such amplifiers in the storage of electrical energy.

By reason of its small size, its very long life, and its extremely low power consumption, as well as its efficient power amplification, the transistor has supplanted the vacuum tube in numerous applications where amplification is required. However, the transistor has heretofore been unable to compete successfully with the vacuum tube as the amplifying element in amplification systems which must have a high input impedance. More specifically, transistor amplifiers having a high input impedance have heretofore been achieved only through the use of complicated and expensive feedback arrangements, or by the use of equally expensive stepdown transformers. Consequently, it has heretofore been economically disadvantageous to utilize transistor amplifiers, instead of vacuum tube amplifiers, in those numerous arrangements which require amplifiers having a high input impedance. Among the arrangements in which transistor amplifiers have heretofore not been commercially feasible, are those energy-storage circuits which comprise a phase-inverting amplifier having a capacitor connected between an output terminal and an input terminal thereof; such circuits find numerous applications, for example in integrating systems suitable for use in analog computers, and in pulse-stretching systems.

It is accordingly an object of the invention to provide improved semiconductive circuit apparatus.

Another object of the invention is to provide an improved transistor amplifier having a high input impedance.

A further object of the invention is to provide an improved transistor amplifier having a high efficiency.

An additional object of the invention is to provide an improved transistor amplifier suitable for use in energy-storage systems.

A still further object of the invention is to provide an improved transistor amplifier having a high input impedance as well as a high current gain.

Still another object of the invention is to provide an improved transistor amplifier having a high input impedance as well as a high voltage gain.

An additional object of the invention is to provide a transistor amplifier which requires very few components.

A still further object of the invention is to provide semiconductive signal-translating apparatus which is inexpensive and easy to construct.

Yet another object of the invention is to provide a novel energy-storage system utilizing transistors.

A specific object of the invention is to provide a novel pulse-stretching circuit utilizing transistor amplification.

The foregoing objects of the invention are achieved by the provision of semiconductive circuit apparatus which comprises first and second transistors each of which has base, emitter and collector electrodes. The apparatus additionally comprises means which generate and supply a signal to the base electrode of the first transistor. A direct connection is made between the emitter electrode of the first transistor and the base electrode of the second transistor, and the collector electrode of the first transistor is connected to a point at reference potential by means which have low impedance at the frequencies of the signal supplied by the aforementioned signal source. Finally, means are connected in series relationship with the emitter-collector path of the second transistor for deriving an output signal from this transistor.

In one preferred arrangement according to the invention, wherein the above-described apparatus forms part of a novel energy-storage circuit, the aforementioned signal-deriving means comprise a load element connected to the collector electrode of the second transistor, while the signal generating and supplying means comprise a signal source and means for connecting this source to the base of the first transistor. In addition, the arrangement includes means which have a capacitive reactance at the frequencies of the signal supplied by the source, and which are connected between the collector electrode of the second transistor and the source-connecting means. Moreover, where the energy-storage circuit is utilized specifically as a pulse-stretcher, the means connecting the signal source to the base of the first transistor include an asymmetrically-conductive device, such as a crystal diode. This device has its terminals connected respectively to the signal source and the aforementioned capacitive-reactance means, and is poled to transmit to a substantial degree only those signals which have the polarity for which the first transistor is in its more conductive condition.

When the signal source of my novel pulse-stretcher supplies a signal having the aforementioned polarity, this signal is transmitted by the source-connecting means to the subsequent transistor stages which, by reason of their novel interconnection, have a high input impedance and a high efficiency. The latter transistor stages voltage-amplify the transmitted signal, producing at the output signal-deriving means, an output signal whose value is determined by the value of the transmitted signal. In addition, the capacitive-reactance means, which interconnect the signal-deriving and the source-connecting means, are charged to a voltage which is equal to the difference between the voltage transmitted by the asymmetrically-conductive device and the output voltage.

When, subsequently, the signal supplied by the source changes its polarity, the asymmetrically-conductive device decouples the source from the remainder of the system by assuming a high impedance. Because of the change in the value of the input signal, the value of the output signal tends to change from its initial value. However, any change in the output signal is fed back by the capacitive-reactance means to the source-connecting means, which transmits the change to the base of the first transistor in a sense tending to oppose the aforementioned change in the output signal. Since the input impedance of the source-connecting means is finite though high, the charge stored by the capacitive-reactance means gradually leaks off through this impedance, thereby causing the value of the output signal to change very gradually toward a final value. However, the duration of this change is many times greater than the time required for the input signal to change polarity. Hence my novel-stretcher may be interposed as a time delay means between the signal source and a device adapted to change its mode of operation in response to a signal having a value intermediate said initial and final values.

In one specific embodiment of the energy-storage circuit of my invention, described hereinafter in detail, there are provided first, second and third transistors of the same conductivity type, having their base-emitter paths directly interconnected in series relationship, in the order named. The collector electrodes of the first and second transistors are connected directly to a source of operating voltage, while the emitter electrode of the third transistor is connected to a point at reference potential. In addition, the collector electrode of the third transistor is connected to the aforesaid voltage source by means of an output resistor. Energy storage is achieved by connecting a capacitor between the base electrode of the first transistor and the collector electrode of the third transistor.

Figure 2:
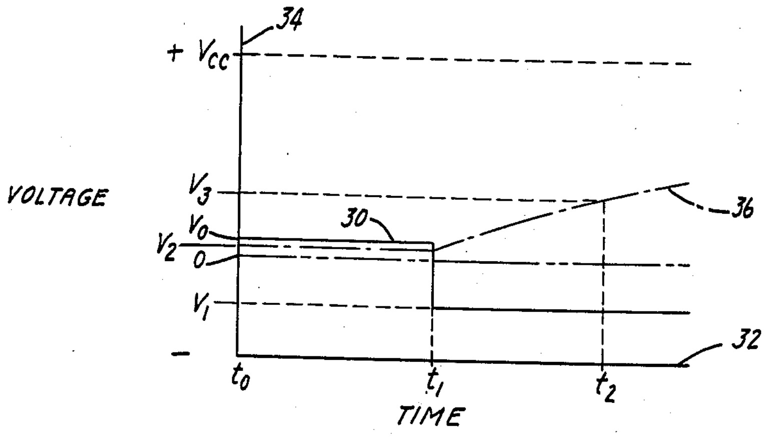

Other advantages and features of the invention will become apparent from a consideration of the following detailed description, taken in connection with the accompanying drawings, in which:

Figure 1 is a schematic diagram of a pulse-stretching system according to my invention; and Figure 2 is a graph to which reference will be made in describing the mode of operation of the novel system shown in Figure 1.

The specific embodiment of the invention shown in Figure 1 includes, as a principal component thereof, my novel transistor amplifier 10, having input terminals 12 and 14 and output terminals 16 and 18. For reasons discussed hereinafter, amplifier 10 is characterized by a high input impedance and a substantial voltage gain. To provide for energy storage in my pulse-stretching system, a capacitor 20 is connected between input terminal 12 and output terminal 16. An input signal is supplied by a signal source 22, which is connected to input terminal 14 directly, and which is connected to input terminal 12 by way of an asymmetrically-conductive device 24. Device 24, which may comprise a crystal diode, for example, has an anode 26 connected to source 22, and a cathode 28 connected to input terminal 12 of transistor amplifier 10.

In the specific embodiment of my invention discussed herein, signal source 22 is constructed and arranged to generate a voltage whose waveform is indicated in Figure 2 by a solid line 30. In Figure 2, the axis of abscissas 32 represents time duration, while the axis of ordinates 34 represents voltage, as measured with respect to reference potential. Thus, as shown in Figure 2, the signal generated by source 22 has a substantially constant voltage value $V_0$ of positive polarity during the time interval $t_0$ to $t_1$. At time $t_1$, this voltage value changes suddenly to a value $V_1$ of negative polarity, and continues at this value for the remainder of the time duration indicated in the figure.

In response to this input signal, my novel pulse-stretching system produces a cross terminal 16, 18, an output signal whose waveform is depicted in Figure 2 by a dashed line 36. More particularly, during the time interval $t_0$ to $t_1$, when the input signal has a constant value $V_0$, the output signal developed across terminals 16, 18 in response thereto is a voltage of constant value $V_2$, which, in the present embodiment, is of positive polarity. However, when, at time $t_1$, the value of the input signal supplied to input terminals 12, 14 changes suddenly from positive $V_0$ to negative $V_1$, the value of the output signal does not change in a corresponding manner. Instead, and in accordance with the invention, the voltage across output terminals 16, 18 changes only very gradually, rising asymptotically at a slow rate toward a value $V_{cc}$. The manner in which this particular output voltage is developed in response to the aforedescribed input voltage is described below in greater detail.

Because the output signal does not change suddenly from an initial to a final value in response to a sudden change in the input voltage, but instead changes only gradually between these two values, my pulse-stretching system is useful as a time-delay means. For example, the output signal of my pulse-stretching system may be supplied to a device (not shown) arranged to undergo a change from a first to a second mode of operation when the input voltage supplied thereto rises to a specified value, intermediate $V_2$ and $V_{cc}$, which is indicated in Figure 2 by $V_3$. Under these conditions, the aforementioned change in mode of operation would occur at a predetermined time, indicated in Figure 2 by $t_2$, which follows $t_1$ by an amount equal to the time required for the output voltage across terminals 16, 18 to change to the aforementioned specified value $V_3$.

Turning now to a more detailed consideration of the structure of my novel amplifier 10, which is incorporated in my novel pulse-stretching system, it is seen that amplifier 10 comprises a transistor 38 which has base, emitter and collector electrodes 40, 42 and 44, respectively, and is connected in the common-emitter configuration. More particularly, emitter 42 is connected directly to a point at reference potential, while collector 44 is connected to a source 46 of operating voltage of value $V_{cc}$ by way of an output resistor 48. In addition, collector 44 is connected to output terminal 16, while emitter 42 is connected to output terminal 18.

In the specific embodiment of the invention here shown, transistor 38 has a base constituted of p-type semiconductive material, for example, p-type silicon. Accordingly, the source 46 is arranged to supply a positive voltage to collector 44. It will of course be understood that transistor 38 need not be a p-type silicon transistor, but may be, for example, an n-type germanium transistor or a surface-barrier transistor.

Amplifier 10 additionally comprises a second transistor 50 which has base, emitter and collector electrodes 52, 54 and 56, respectively, and which is preferably of the same conductivity type as transistor 38, i.e. a p-type transistor in this embodiment. Transistor 50 is connected in the common-collector configuration, i.e., its collector 56 is connected directly to the voltage source 46. Moreover, in accordance with an important aspect of the invention, the sole means for completing the emitter-collector D.-C. path of transistor 50, and the base-return path of transistor 38, is a direct connection 58 established between emitter 54 of transistor 50 and base 40 of transistor 38. As a result of this connection, the output load of transistor 50 consists substantially only of transistor 38.

The foregoing connection accomplishes two highly desirable results. Firstly, it raises the efficiency of that portion of amplifier 10 comprising transistors 38 and 50 to a value approaching the maximum value which is theoretically attainable, by eliminating those losses in the intensity of the signal current supplied to transistor 38 which would be occasioned by the connection of coupling impedances between conductor 54 and a point at reference potential. Secondly, it establishes the input impedance between the base 52 of transistor 50 and a point at reference potential at a very high value. This desirable result is achieved by taking advantage of the fact that the input impedance of a transistor connected in the common-collector configuration (as is transistor 50) is directly dependent on the impedance of the load connected in series with its emitter, and moreover, in all practical cases, exceeds the value of the load impedance. In the present instance, the sole load which is presented to transistor 50 is the input impedance displayed by transistor 38, which is relatively high because of its connection in the common-emitter configuration. Consequently, the aforementioned impedance of transistor 50, between base electrode 52 and a point at reference potential, is very high.

As is well-known, a transistor connected in the common-emitter configuration (as is transistor 38) is characterized by a substantial voltage gain. Accordingly, it is clear that that portion of amplifier 10 including transistors 38 and 50 constitutes a voltage amplifier having a substantial voltage gain and a high input impedance.

In accordance with an additional important aspect of the invention, and in the preferred embodiment, the input impedance of amplifier 10 is increased still further by providing a third transistor 60 which has base, emitter and collector electrodes 62, 64 and 66, respectively, and which is connected in the common-collector configuration in the same manner as transistor 50. Specifically, transistor 60, which preferably is of the same conductivity type as transistors 38 and 50, has its collector 66 connected directly to voltage source 46. Base 62 is connected directly to input terminal 12, while input terminal 14 is connected to a point at reference potential.

In accordance with the invention in a further aspect, the emitter 64 of transistor 60 is connected to base 52 of transistor 50 solely by a conductive lead 68. This lead serves to complete the D.-C. base return path of transistor 50, and importantly serves to connect transistor 50 to the emitter 64 of transistor 60, as an output load therefor. As discussed in connection with transistors 38 and 50, by reason of the foregoing connection and the omission of any additional coupling devices, the efficiency of the two stages of amplifier 10 which comprise transistors 50 and 60 is very high. Moreover, because of the very high input impedance of transistor 50, which serves as the load for transistor 60, the input impedance between base 62 of transistor 60 and a point at reference potential (i.e., between input terminals 12 and 14) is exceedingly high.

Thus, because of its novel structure, amplifier 10 is characterized by a high efficiency, a high input impedance and a substantial voltage gain, despite the fact that it contains very few parts, no feedback circuits and no transformers whatever.

The novel cooperation between amplifier 10 and the remaining components of my pulse-stretching system will now be set forth.

When, at time $t_0$ (see Figure 2), signal source 22 supplies, to the anode 26 of diode 24, a positive voltage $V_0$ exceeding the respective potentials of base 62 and emitter 64 of transistor 60, diode 24 assumes a low impedance, and, as a result, the potential of base 62 is raised almost to the voltage $V_0$. This positive input voltage produces a very small current within the very high impedance base-emitter circuit of transistor 60. This very small current undergoes a large amount of current amplification in transistor 60, and the amplified current is supplied by lead 68 to transistor 50, by which it is amplified still further.

There is therefore produced, in lead 58, a current of considerable intensity, which corresponds to the current of very small intensity supplied by source 22. This current in lead 58 is supplied to the base 40 of transistor 38. Transistor 38, in turn, converts the input current into an output voltage by producing a corresponding flow of current through collector 44, and hence through output resistor 48. In the present instance, the voltage drop produced by the flow of collector current through resistor 48 depresses the voltage at collector 44 to the value $V_2$ (see Figure 2), which is less than the voltage $V_{cc}$ supplied by source 46. This voltage $V_2$ therefore appears across output terminals 16, 18 as the voltage produced in response to input voltage $V_0$.

Thus, during the time that the input signal supplied to terminals 12, 14 has a value $V_0$, the output signal produced across terminals 16, 18 has a value $V_2$. Accordingly, a voltage difference equal to $(V_0-V_2)$ exists between input terminal 12 and output terminal 16, and the capacitor 20 connected there between charges substantially to this potential difference. Once having attained this charge, capacitor 20 will tend to maintain the output voltage developed across terminals 16 and 18 substantially at the value $V_2$, regardless of changes in the input signal applied across input terminals 12 and 14. This tendency of capacitor 20 is aided by the functioning of diode 24.

More particularly, when, at time $t_1$, the value of the input signal changes suddenly from $V_0$ volts of positive polarity to $V_1$ volts of negative polarity, the anode 26 of diode 24 is driven negative with respect to its cathode 28. As a result, the impedance of diode 24 becomes very high, so that source 22 is effectively decoupled from input terminals 12, 14. Because source 22 no longer supplies a positive voltage to base electrode 62 of transistor 60, the potential of this electrode tends to become less positive and, as a result, the output voltage at collector 44 of transistor 38 tends to become more positive. However, any transient rise in the output voltage at collector 44 is fed back by capacitor 20 to base 62. Since amplifier 10 has a substantial voltage gain, the value of the positively rising voltage fed back to base 62 may be adjusted to maintain this electrode at substantially $V_0$ volts. However, because the input impedance of amplifier 10 is finite though high, the charge stored by capacitor 20 tends to leak off therethrough. Hence, the voltage applied to base 62 of transistor 60 (which is equal to the sum of the voltage at collector 44 and the voltage across capacitor 20) gradually declines, thereby permitting the voltage across output terminals 16, 18 to rise gradually toward the source voltage $V_{cc}$, as shown by line 36 in Figure 2. This gradual rise in output voltage after time $t_1$, as contrasted to the sudden fall in input voltage at time $t_1$, constitutes a considerable "stretching" of the effect of the positive input voltage $V_0$ beyond the time $t_1$.

In a typical case, the parameters of my novel system may have the following values:

| | |
|---|---|
| Capacitor **20** | 0.68 microfarad. |
| Asymmetrically - conductive device | Crystal diode 1N209. |
| Each of transistors **38, 50** and **60** | Texas Instrument Company Type 901 n-p-n silicon transistor. |
| Source **46** ($V_{cc}$) | +12 volts D.-C. |
| Resistor **48** | 10,000 ohms. |
| Voltage $V_0$ | +0.6 volt. |
| Voltage $V_1$ | −3 volts. |

In a system having the foregoing parameters, the input impedance of amplifier 10 is approximately 1 megohm, the voltage gain of amplifier 10 is approximately 20, and the system is capable of providing time delays of the order of seconds. It is to be understood that the foregoing values are merely exemplary, and that I do not intend to limit the scope of my invention thereto.

From the foregoing discussion, it is clear that further increases in the input impedance of amplifier 10 may be obtained by including, in amplifier 10, additional common-collector transistor stages connected in the manner of transistor 60. It has been found, however, that the ability of the system to maintain its operating characteristics substantially constant despite changes in ambient temperature is generally reduced as the number of such additional stages is increased.

In addition, it is clear that, in a pulse-stretching system according to my invention, transistor 60 may be omitted, and input terminal 12 and capacitor 20 may be connected directly to base 58 of transistor 56. Such an arrangement is less expensive than the preferred embodiment and is more stable under conditions of widely changing temperature, but suffers the disadvantage of a somewhat lessened input impedance for amplifier 10.

Moreover, it is clear that my novel arrangement may be modified in obvious ways to perform many other functions. For example, my system may be connected as the capacitive element of a resistance-capacitance voltage integrator by removing diode 26 and replacing it with a resistor. Additional uses for my arrangement, for example, as the capacitive element in sweep circuits and in filter arrangements, will suggest themselves to those skilled in the art.

While I have described my invention by means of specific examples and in a specific embodiment, I do not wish to be limited thereto, for obvious modifications will occur to those skilled in the art without departing from the scope of my invention.

What I claim is:

1. Signal-translating apparatus comprising first, second and third transistors each having base, emitter and collector elements, said base elements of all of said transistors being of the same conductivity type, means for supplying all of the emitter current of said first transistor to said base element of said second transistor, means for supplying all of the emitter current of said second transistor to said base element of said third transistor, means for applying an operating voltage between said emitter element of said third transistor and said collector elements of said first and second transistors, means for applying an input signal between said base element of said first transistor and said emitter element of said third transistor, and a load element connected between said collector element of said third transistor and said collector elements of said first and second transistors.

2. Energy-storage apparatus comprising an amplifier having first, second and third transistors each having base, emitter and collector elements, said base elements of all of said transistors being of the same conductivity type, means for supplying all of the emitter current of said first transistor to said base element of said second transistor, means for supplying all of the emitter current of said second transistor to said base element of said third transistor, means for applying an operating voltage between said emitter element of said third transistor and said collector elements of said first and second transistors, and a resistive element connected between the collector element of said third transistor and said collector elements of said first and second transistors; capacitive means connected between said collector element of said third transistor and said base element of said first transistor; a source of an input signal, means connecting one terminal of said source to said emitter element of said third transistor, and asymmetrically-conductive means connecting another terminal of said source to said base element of said first transistor, said asymmetrically-conductive means exhibiting a low impedance to said input signal when its polarity is such that an increase in its magnitude tends to increase the intensity of the base-emitter current of said first transistor, and exhibiting a high impedance to said input signal when its polarity is opposite the last-named polarity.

References Cited in the file of this patent

UNITED STATES PATENTS

| | | |
|---|---|---|
| 2,591,961 | Moore et al. | Apr. 8, 1952 |
| 2,644,897 | Lo | July 7, 1953 |
| 2,663,806 | Darlington | Dec. 22, 1953 |
| 2,663,830 | Oliver | Dec. 22, 1953 |
| 2,761,965 | Dickinson | Sept. 4, 1956 |
| 2,801,298 | Mital | July 30, 1957 |

OTHER REFERENCES

Electronics, August 1953, "Junction Transistor Circuit Applications," by Peter Sulzer.

Radio Electronics, January 1955, "Transistorized Portable Receiver," by Herzog et al.